United States Patent
Saida et al.

(10) Patent No.: US 7,651,745 B2
(45) Date of Patent: *Jan. 26, 2010

(54) DISPLAY DEVICE

(75) Inventors: Shinsuke Saida, Tenri (JP); Noriko Watanabe, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/859,093

(22) Filed: Sep. 21, 2007

(65) Prior Publication Data

US 2008/0013020 A1 Jan. 17, 2008

Related U.S. Application Data

(63) Continuation of application No. 10/979,724, filed on Nov. 2, 2004, now Pat. No. 7,378,137.

(30) Foreign Application Priority Data

Nov. 6, 2003 (JP) .............................. 2003-377069

(51) Int. Cl.
*B32B 17/04* (2006.01)
*G02F 1/136* (2006.01)

(52) U.S. Cl. ...................... 428/1.6; 428/1.51; 442/180; 442/187; 349/158

(58) Field of Classification Search ................ 428/1.51, 428/1.53, 1.6, 1.62; 349/158; 359/443, 459, 359/461; 442/71, 175, 180, 187
See application file for complete search history.

(56) References Cited

U.S. PATENT DOCUMENTS

| | | | | |
|---|---|---|---|---|
| 3,789,049 A * | 1/1974 | Nagasawa | .................... | 523/213 |
| 5,789,848 A * | 8/1998 | Dworsky et al. | ............ | 313/310 |
| 6,184,968 B1 * | 2/2001 | Taylor-Smith | .............. | 349/158 |
| 6,413,645 B1 * | 7/2002 | Graff et al. | .................. | 428/446 |
| 6,492,026 B1 * | 12/2002 | Graff et al. | ............... | 428/411.1 |
| 6,556,470 B1 * | 4/2003 | Vincent et al. | .............. | 365/151 |
| 6,590,346 B1 * | 7/2003 | Hadley et al. | ............ | 315/169.3 |
| 6,753,047 B1 * | 6/2004 | Athey | ........................ | 428/1.21 |
| 6,853,478 B2 * | 2/2005 | Vincent et al. | .............. | 359/296 |
| 6,890,635 B2 * | 5/2005 | Lin et al. | ................. | 428/295.1 |
| 7,242,453 B2 | 7/2007 | Saida et al. | | |
| 7,259,803 B2 * | 8/2007 | Akada et al. | ......... | 257/E31.041 |
| 2003/0141596 A1 * | 7/2003 | Nakamura et al. | .......... | 257/758 |
| 2005/0129877 A1 | 6/2005 | Akada et al. | | |
| 2005/0140861 A1 | 6/2005 | Saida et al. | | |

FOREIGN PATENT DOCUMENTS

JP 2003-048279 A 2/2003

OTHER PUBLICATIONS

JPO Website Machine English Translation of JP 2003-098512, Furukawa et al., Apr. 3, 2003.*
Saida et al.; "Display Device;" U.S. Appl. No. 10/979,724, filed Nov. 2, 2004.

* cited by examiner

*Primary Examiner*—David R Sample
*Assistant Examiner*—Sophie Hon
(74) *Attorney, Agent, or Firm*—Keating & Bennett, LLP

(57) ABSTRACT

The display device of the invention includes: a first plastic substrate including a composite layer having a resin-impregnated fiber fabric, an inorganic barrier layer 25 formed on the composite layer, and a planarizing resin layer formed on the inorganic barrier layer; and a display medium layer formed on the planarizing resin layer-side of the first plastic substrate.

9 Claims, 4 Drawing Sheets

DISPLAY DEVICE

This application is a continuation of application Ser. No. 10/979,724, filed Nov. 2, 2004, now U.S. Pat. No. 7,378,137.

BACKGROUND OF THE INVENTION

1. Field of the Invention

The present invention relates to a display device having a plastic substrate and a fabrication method therefor, and more particularly, relates to a display device having a fiber-filled plastic substrate.

2. Description of the Related Art

In recent years, use of liquid crystal display devices and organic EL display devices for portable information terminal equipment has expanded thanks to their features of being thin, light in weight and low in power consumption. With this expansion of the use, there have arisen strong requests that such display devices should be further light and thin and improved in shock resistance and other properties.

To respond to the above requests, an idea of using a plastic substrate instead of the conventionally used glass substrate has been proposed. However, many problems to be overcome are present to adopt a plastic substrate made of a resin material in a sheet shape as a substrate of a display device.

One of the biggest problems is that a plastic substrate is large in linear expansivity (i.e., coefficient of linear thermal expansion). While the linear expansivity of glass is generally several ppm/° C., that of even a type of plastic small in linear expansivity is as large as several tens of ppm/° C. Being large in linear expansivity indicates that the variation in size with temperature is large. Using such a material, therefore, it is difficult to fabricate drive elements, such as TFTs, which require high-precision patterning. A plastic substrate may be used as a counter substrate while the conventional glass substrate being used as the substrate on which TFTs are formed (hereinafter, this substrate is also simply called a "TFT substrate"). In this case, also, difficulty is found in positioning color filters (and/or a black matrix) formed on the counter substrate with respect to pixel electrodes on the TFT substrate.

To reduce the linear expansivity of a plastic substrate to thereby improve the size stability, there have been proposed methods of forming a plastic substrate using a material having a filler mixed in a resin matrix (composite material). As used herein, a plastic substrate formed of a composite material is specifically called a "composite substrate" in some cases.

For example, Japanese Laid-Open Patent Publication No. 11-2812 (Literature 1) discloses a reflection conductive substrate having a composite substrate formed by impregnating a glass fiber fabric with a resin and curing the resin.

Japanese Laid-Open Patent Publication No. 2001-133761 (Literature 2) discloses a composite substrate having fibers arranged in lines or stripes in a resin so as to be kept off from one another. According to Literature 2, the composite substrate having the impregnated fiber fabric (woven fabric) disclosed in Literature 1 has a problem that woven portions and intersecting portions of fibers of the fiber fabric cause development of minute unevenness on the substrate surface and this degrades the display quality. Literature 2 argues that the disclosed arrangement can provide a composite substrate having a flat surface.

As pointed out in Literature 2, a plastic substrate formed using a glass fiber fabric has an uneven surface. As for the plastic substrate disclosed in Literature 2, fabrication of such a plastic substrate is difficult. Even if the fabrication is successful, it is difficult to reduce the surface unevenness to the level of 100 nm or less, for example.

To planarize the surface of the plastic substrate, a planarizing film may be formed on the uneven surface described above. By forming such a planarizing film, a flat surface having unevenness reduced to the level of 100 nm or less can be provided. However, according to examinations conducted by the inventors of the present invention, the following problem occurs. When an inorganic barrier layer is formed on the planarized surface, unevenness of 100 nm or more develops on the surface of the resultant inorganic barrier layer in some cases. The inorganic barrier layer is formed to improve the barrier properties of the plastic substrate against water and/or oxygen in the air.

SUMMARY OF THE INVENTION

An object of the present invention is providing a display device having a plastic substrate that includes an inorganic barrier layer and is excellent in surface flatness.

The display device of the present invention includes: a first plastic substrate including a composite layer having a resin-impregnated fiber fabric, an inorganic barrier layer formed on the composite layer, and a planarizing resin layer formed on the inorganic barrier layer; and a display medium layer formed on the planarizing resin layer-side of the first plastic substrate.

In one embodiment, the display device further includes a second plastic substrate placed to face the first plastic substrate via the display medium layer, wherein the second plastic substrate is the same in construction as the first plastic substrate.

In another embodiment, the display medium layer includes an organic luminescence layer.

In yet another embodiment, the display medium layer is a liquid crystal layer.

In yet another embodiment, the inorganic barrier layer covers the entire area of the composite layer facing the display medium layer.

The fabrication method for a display device of the present invention is a fabrication method for the display device described above, wherein a process for fabricating the first and second plastic substrates comprises the steps of: preparing the composite layer having the resin-impregnated fiber fabric; forming the inorganic barrier layer on a surface of the composite layer by thin film deposition at a first temperature; and forming the planarizing resin layer on the inorganic barrier layer at a second temperature lower than the first temperature.

In one embodiment, the first temperature is 200° C. or more.

In another embodiment, the inorganic barrier layer includes silicon dioxide.

In the plastic substrate of the display device of the present invention, the planarizing resin layer is formed on the inorganic barrier layer that is formed on the composite layer having the resin-impregnated fiber fabric. Therefore, it is possible to prevent occurrence of the problem that the surface of the inorganic barrier layer becomes uneven in the heating process for forming the inorganic barrier layer on the planarizing resin layer, and thus a flat surface can be obtained. When such a plastic substrate is used for a liquid crystal display device, for example, the resultant device is free from variations in cell thickness due to unevenness of the plastic substrate and thus can provide high-quality display.

DETAILED DESCRIPTION OF THE INVENTION

As mentioned in the prior art description, the present inventors have found a phenomenon that when an inorganic barrier layer is deposited on the surface of a planarizing film of a composite substrate having given flatness, the flatness is lost and unevenness develops on the surface of the inorganic barrier layer. This phenomenon will be described with reference to FIGS. 1A, 1B, 2A and 2B.

Figure 1A:
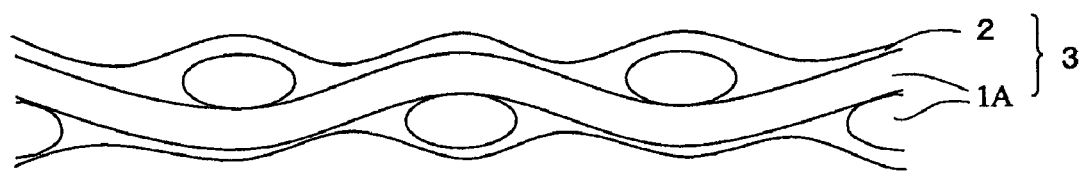
FIGS. 1A and 1B are a cross-sectional view and a plan view, respectively, diagrammatically showing a resin-impregnated fiber fabric.
Figure 1B:
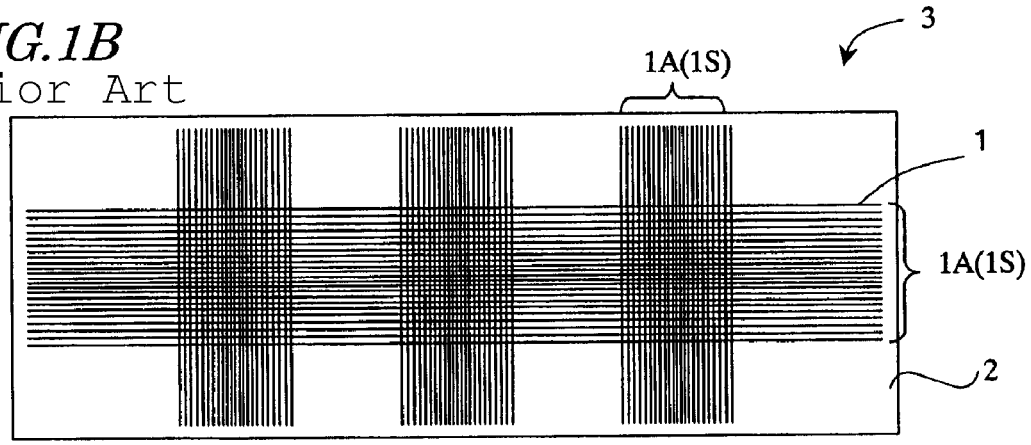

FIGS. 1A and 1B are a cross-sectional view and a plan view, respectively, diagrammatically showing part of a resin-impregnated glass fiber fabric 3.

The resin-impregnated glass fiber fabric 3 shown in FIGS. 1A and 1B includes a glass fiber fabric 1S and a resin layer 2 covering the glass fiber fabric 1S. The glass fiber fabric 1S is a plain-woven fabric of fiber bundles 1A each composed of a plurality of glass fibers 1. By dipping the glass fiber fabric 1S in an epoxy resin, for example, the resin layer 2 is formed as a thin film covering the surfaces of the glass fiber bundles 1A. As diagrammatically shown in FIG. 1A, the resin-impregnated glass fiber fabric 3 has projections and depressions corresponding to woven portions at which the fiber bundles 1A intersect each other.

For example, the diameter of each of the fibers 1 constituting each fiber bundle 1A is about 10 μm, the width of the fiber bundle 1A is about 200 μm, and the pitch of the fiber bundles 1A is about 500 μm vertically and horizontally. The thickness of the resin layer 2 is about 20 μm, for example. The resultant resin-impregnated fiber fabric 1S has unevenness (undulation) of the level of about 500 nm to 600 nm.

Figure 2A:
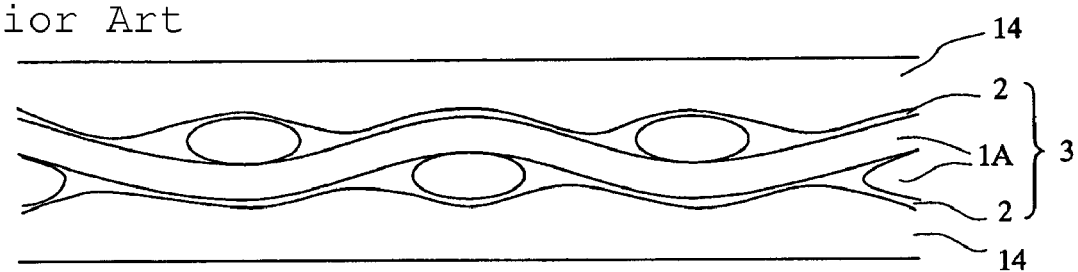
FIGS. 2A and 2B are views showing a fabrication process of a conventional plastic substrate 10, which also demonstrate the mechanism of increase of surface unevenness.
Figure 2B:
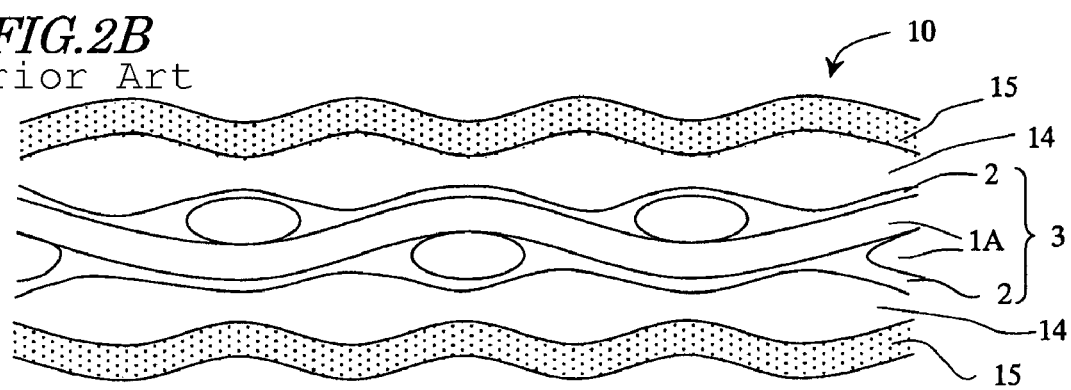

Conventionally, as shown in FIG. 2A, a planarizing resin layer 14 is formed for planarizing the uneven surface of the resin-impregnated glass fiber fabric 3. The unevenness of the surface is reduced to the level of about 100 nm by providing the planarizing resin layer 14.

On the planarizing resin layer 14, an inorganic barrier layer 15 is formed to improve the barrier properties against water and/or oxygen in the air. The inorganic barrier layer 15, having a thickness of about 100 nm, is formed by depositing $SiO_2$ in a heating film formation process (vacuum evaporation at 200° C., for example). With this formation, the surface of the resultant plastic substrate 100 (surface of the inorganic barrier layer 15) has unevenness increased to the level of about 400 nm, as diagrammatically shown in FIG. 2B.

Figure 3:
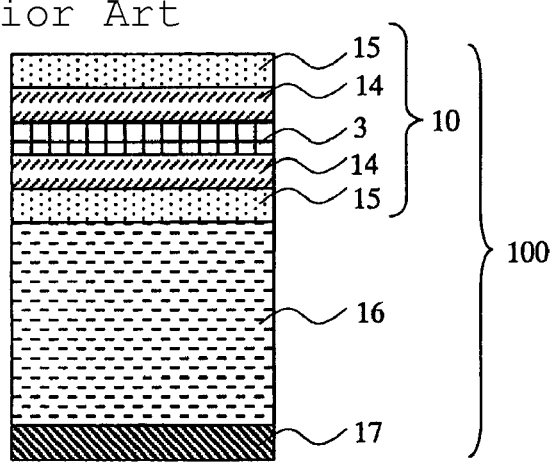
FIG. 3 is a view diagrammatically showing a conventional liquid crystal display device 100.

FIG. 3 is a view diagrammatically showing a liquid crystal display device 100 using the plastic substrate 10 described above, in which a liquid crystal layer 16 is sandwiched between the plastic substrate 10 and a substrate (glass substrate, for example) 17. In the liquid crystal display device 100, a nonuniform distribution arises in the thickness of the liquid crystal layer 16 (cell thickness) under the effect of the uneven surface of the plastic substrate 10. The nonuniform thickness distribution of the liquid crystal layer 16 causes a nonuniform distribution of retardation, and this is visually observed as display unevenness.

The present inventors examined the mechanism of re-development of unevenness on the once-planarized surface based on various experiment results, and reached the following conclusion.

During the deposition of $SiO_2$ on the planarizing resin layer 14 shown in FIG. 2A, the substrate (that is, the resin-impregnated fiber fabric 3 and the planarizing resin layer 14 formed thereon) is heated to 200° C., for example. Since the substrate has regions different in the volume fraction of the fibers 1 from one another, a nonuniform distribution arises in the thermal expansion amount. Specifically, the thermal expansion amount is small in regions having a larger number of fibers 1, while it is large in regions having a smaller number of fibers 1. Naturally, the thermal expansion amount is largest in regions having no fibers 1. With this nonuniform distribution of the thermal expansion amount, unevenness develops on the surface of the substrate (surface of the planarizing resin layer 14). When $SiO_2$ is deposited on this uneven surface, the surface of the resultant $SiO_2$ film (inorganic barrier layer) is also uneven reflecting the unevenness of the underlying layer. The $SiO_2$ film is small in thermal expansion coefficient and rigid (high in modulus of elasticity) compared with resin. Therefore, the unevenness on the surface of the substrate is retained even after the film formation process is terminated and the temperature returns to room temperature.

In consideration of the mechanism described above that the level of unevenness increases by forming the inorganic barrier layer 15 on the planarizing resin layer 14 having a flat surface (unevenness: 100 nm or less), it is understood that if the inorganic barrier layer 15 is formed first and the planarizing resin layer 14 is formed on the inorganic barrier layer 15, a surface having unevenness of 100 nm or less can be obtained.

A plastic substrate suitably used for a display device of an embodiment of the present invention and a fabrication method for such a plastic substrate will be described with reference to FIGS. 4A, 4B and 5.

Figure 4A:
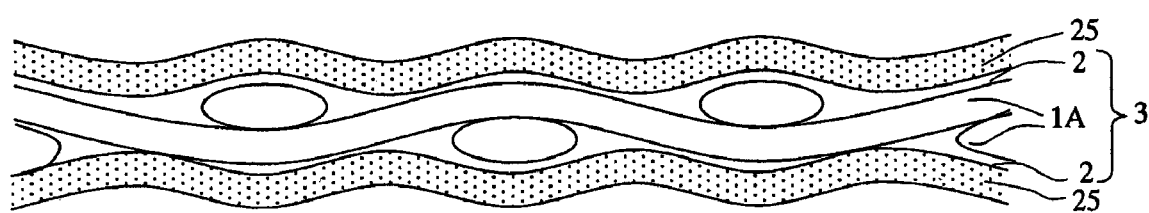
FIGS. 4A and 4B are views diagrammatically showing a fabrication process of a plastic substrate 20 suitably used in an embodiment of the present invention.
Figure 4B:
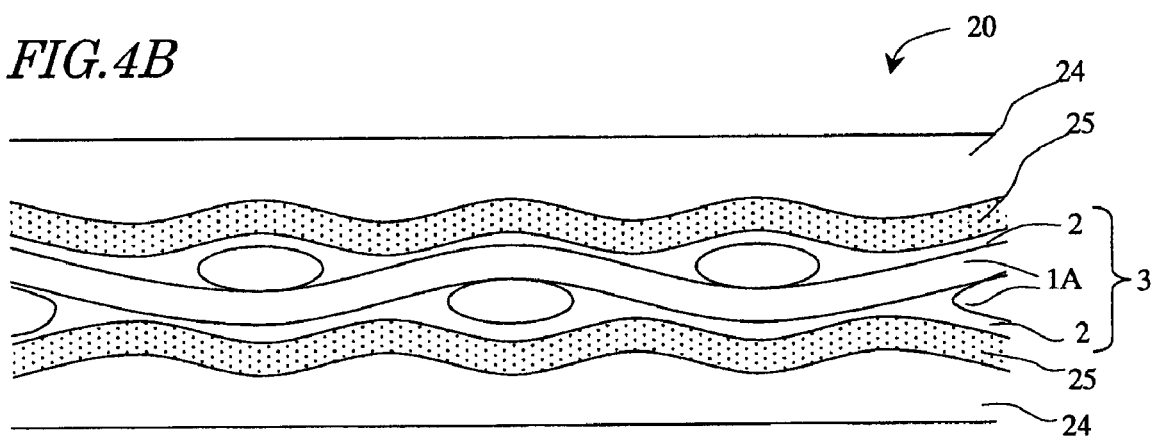

Referring to FIG. 4A, a resin-impregnated fiber fabric 3, which can be the same as the conventional one described above, is prepared. An inorganic barrier layer 25 is then deposited on the resin-impregnated fiber fabric 3. The material and the deposition method for the inorganic barrier layer 25 may be the same as those conventionally used. A $SiO_2$ film having excellent barrier properties is preferably used as the inorganic barrier layer 25. The water vapor transmission of the $SiO_2$ film (thickness: 100 nm) is 0.4 $g/m^2/day$. When formed at room temperature, however, the $SiO_2$ film is poor in chemical resistance, and this may cause a problem in a TFT fabrication process, for example. Therefore, the deposition is preferably made under heating, specifically at 200° C. or more. The thickness of the inorganic barrier layer 15 is preferably about 20 nm or more from the standpoint of the barrier properties and about 300 nm or less from the standpoint of maintaining the flexibility of the substrate. $SiN_x$, PSG and the like may be used in place of $SiO_2$.

A planarizing resin layer 24 is formed on the thus-deposited inorganic barrier layer 25. The planarizing resin layer 24 may be formed of the same material in the same manner as those conventionally adopted. For example, the same material as that of the resin layer 2 of the resin-impregnated fiber fabric 3 may be used. Such a resin material is preferably selected to have a refractive index roughly identical to that of the glass fibers 1 and $SiO_2$. Also such a resin should preferably be excellent in chemical resistance and heat resistance. For example, an epoxy resin may be used. The planarizing resin layer is preferably formed at a temperature lower than the temperature used for formation of the inorganic barrier layer. Specifically, the temperature is preferably 200° C. or less.

The surface of the thus-formed planarizing resin layer 24 has unevenness of 100 nm or less as that of the planarizing resin layer 14 shown in FIG. 2A has. In this case, however, since formation of an inorganic barrier layer is no more necessary on the planarizing resin layer 24, there is no increase in the level of unevenness unlike the case shown in FIG. 2B. In this way, a plastic substrate 20 with unevenness reduced to 100 nm or less is obtained.

Figure 5:
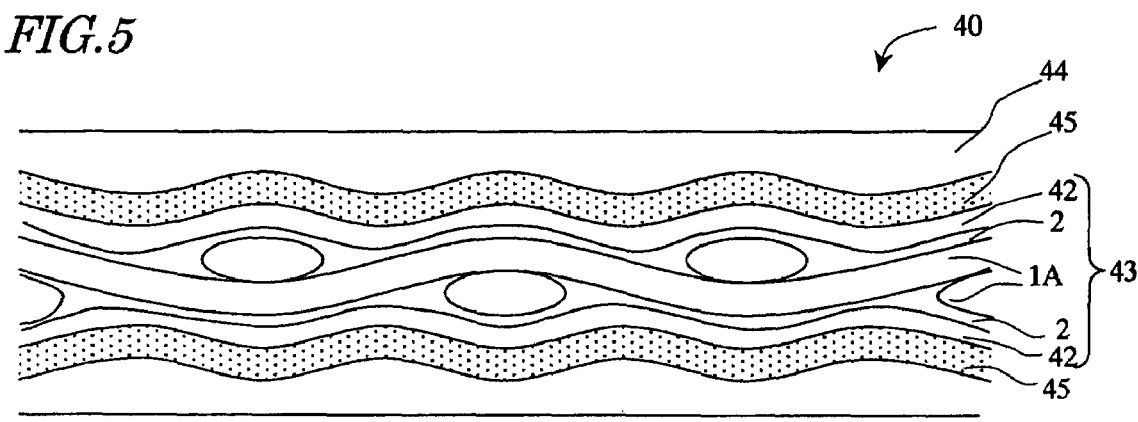
FIG. 5 is a cross-sectional view diagrammatically showing a plastic substrate 40 suitably used in an embodiment of the present invention.

A plastic substrate 40 diagrammatically shown in FIG. 5 may also be used in place of the plastic substrate 20.

In the plastic substrate 40 of FIG. 5, a planarizing resin layer 42 is formed on the resin-impregnated fiber fabric 3 shown in FIG. 4A, an inorganic barrier layer 45 is then formed on the planarizing resin layer 42, and further a planarizing resin layer 44 is formed on the inorganic barrier layer 45. This is like forming another planarizing resin layer on the surface of the plastic substrate 10 of FIG. 2B. That is, when the inorganic barrier layer 45 is deposited on the planarizing resin layer 42 under heating, the unevenness of the resultant surface increases. However, by further forming the planarizing resin layer 44 on the inorganic barrier layer 45, a plastic substrate of which the surface unevenness is reduced to 100 nm or less is obtained.

Assume herein that the resin-impregnated fiber fabric 3 and the planarizing resin layer 42 formed thereon constitute a composite layer 43. The plastic substrate 40 then includes the composite layer 43, the inorganic barrier layer 45 formed on the composite layer 43, and the planarizing resin layer 44 formed on the inorganic barrier layer 45. In the plastic substrate 20 of FIG. 4B, the composite layer includes only the resin-impregnated fiber fabric 3. Thus, a flat surface can be obtained by forming an inorganic barrier layer on the composite layer and then forming a planarizing resin layer on the inorganic barrier layer.

As an example of the plastic substrate 40, described will be the case of using the composite layer 43 composed of the E-glass fiber fabric (fiber diameter: 10 μm, width of fiber bundle: 200 μm, pitch of fiber bundles: 500 μm) impregnated with an epoxy resin described above and the planarizing resin layer 42 formed on the resin-impregnated fiber fabric.

$SiO_2$ was deposited by evaporation at about 200° C. to a thickness of about 100 nm on the surface of the composite layer 43 of which the unevenness was about 120 nm before the formation of the inorganic barrier layer 45. The unevenness of the resultant surface increased to about 190 nm. The planarizing resin layer 44 was then formed on the above surface to a thickness of about 10 μm using the same epoxy resin as that used for the resin with which the glass fiber fabric 3 was impregnated and the planarizing resin layer 42. As a result, the unevenness of the surface was reduced to about 90 nm. Note that the plastic substrate had a size of 127 mm×127 nm and roughly the entire surface was examined for the unevenness. The inorganic barrier layer must be formed at least over the entire display regions, and thus should preferably be formed over the entire surface of the substrate. The inorganic barrier layer may not be formed on the surface opposite to the surface facing a liquid crystal layer or an organic EL layer.

As described above, the plastic substrates 20 and 40, of which the surface unevenness is as small as 100 nm or less, can ensure good display when they are applied to display devices.

The materials for the plastic substrate suitably used for the display device of the present invention are not limited to those described above.

As the transparent resin used for the transparent plastic substrates 20 and 40, usable are general transparent resins, thermosetting resins such as epoxy resins, phenol resins, phenol-epoxy blend resins and bismaleimide-triazine blend resins, and thermoplastic resins such as polycarbonate, polyethersulfone and polyetherimide.

As the transparent fibers, usable are inorganic fibers such as E glass, D glass and S glass and organic fibers made of a resin such as aromatic polyimide. The transparent fibers are preferably used in the form of fiber bundles, further preferably used in the form of a fabric, as described above.

To improve the mechanical strength of the composite substrate and also enhance the uniformity of the mechanical properties and optical properties of the composite substrate, the fibers are preferably arranged uniformly in the plane, the diameter of the fibers and the width of the fiber bundles are preferably smaller, and the pitch of the fiber bundles is also preferably smaller. Specifically, the diameter of each fiber is preferably about 20 μm or less, more preferably about 10 μm. The width of each fiber bundle is preferably 200 μm or less, and the pitch of the fiber bundles is preferably 500 μm or less.

Although a plain-woven fabric is most preferred as the fiber fabric, other general weaves such as satin weave and diagonal weave may be adopted, and even a nonwoven fabric may be used.

The transparency of the plastic substrate is preferably higher. Therefore, to suppress diffuse reflection at the interfaces between the fibers and the resin matrix and scattering at fibers, the fibers and the resin should preferably be selected to have the same refractive index if possible. In general, the material of the resin matrix has a wider range of selection than the material of the fibers. Also, the resin can be modified using a substituent in the resin skeleton (for example, the refractive index can be made low with introduction of a fluorine atom, or high with introduction of a bromine atom). Thus, the refractive index is preferably adjusted by modifying the resin.

The plastic substrate can be fabricated by various known methods using the materials for the fibers (fiber bundles and woven fabric) and the resin matrix described above. In the case of using a thermosetting resin, methods such as compression molding, rolling molding, casting and transfer molding may be employed. In the case of using a thermoplastic resin, methods such as compression, injection molding and extrusion may be employed.

Figure 6:
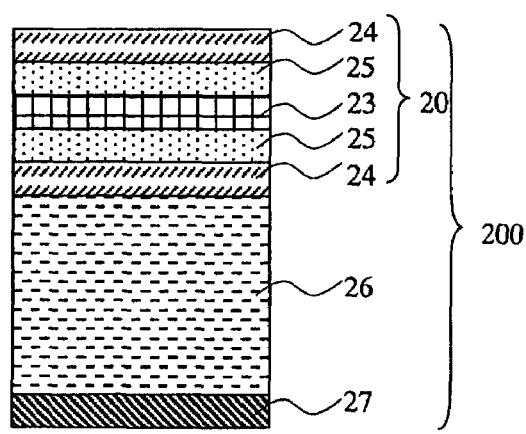
FIG. 6 is a cross-sectional view diagrammatically showing a liquid crystal display device 200 of an embodiment of the present invention.

FIG. 6 diagrammatically shows a liquid crystal display device 200 of an embodiment of the present invention.

The liquid crystal display device 200 includes: a fiber-filled transparent plastic substrate 20 essentially composed of a composite layer 23 having the resin-impregnated fiber fabric 3, inorganic barrier layers 25 for prevention of water vapor transmission formed on the composite layer 23, and planarizing resin layers 24 formed on the inorganic barrier layers 25; a plastic substrate 27; and a liquid crystal layer 26 provided between the plastic substrates 20 and 27. As the plastic substrate 27, the same substrate as the plastic substrate 20 is preferably used when a transmission or a transmission/reflection (transflective) display device is fabricated. When a reflection liquid crystal display device is fabricated, in which no transparency is required for the plastic substrate 27, another construction may be adopted.

The liquid crystal display device 200 can be fabricated in a general process using the plastic substrate 20 and the plastic substrate 27 having the same construction as the plastic substrate 20. For example, TFT elements, a transparent conductive film (ITO) and an alignment film are formed on one substrate, while color filters, a transparent conductive film (ITO) and an alignment film are formed on the other substrate. The transparent conductive film is formed by subjecting ITO to vacuum evaporation at a temperature less than 200° C. (room temperature, for example), for example. The alignment film is applied at room temperature and baked at a temperature less than 200° C. (150° C. to 170° C., for example). A sealant is provided on the substrate having the color filters, and spacers are scattered on the substrate having the TFTs. These substrates are then bonded together. A liquid crystal material is then injected into the gap between these substrates by vacuum injection. The surfaces of the substrates of the resultant liquid crystal display device have unevenness reduced to 100 nm or less, and thus the display quality is prevented from degrading due to variations in cell thickness.

Figure 7:
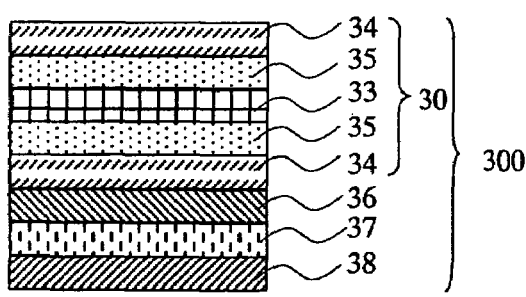
FIG. 7 is a cross-sectional view diagrammatically showing an organic EL display device 300 of an embodiment of the present invention.

FIG. 7 diagrammatically shows an organic EL display device 300 of an embodiment of the present invention.

The organic EL display device 300 includes: a fiber-filled transparent plastic substrate 30 essentially composed of a composite layer 33 having the resin-impregnated fiber fabric 3, inorganic barrier layers 35 formed on the composite layer 33, and planarizing resin layers 34 formed on the inorganic barrier layers 35; an anode 36 formed on the plastic substrate 30; an organic luminescence layer 37 formed on the anode 36; and a cathode 38 formed on the organic luminescence layer 37. The plastic substrate 30 is substantially the same in construction as the plastic substrate 20 described above, and thus the surface thereof has unevenness reduced to 100 nm or less. The organic EL display device can be fabricated in a general process. For example, a transparent electrode (ITO) as the anode is formed on the flat surface of the substrate 30. The organic luminescence layer is formed by vacuum evaporation, and a transparent electrode (ITO) as the cathode is formed on the organic luminescence layer by vacuum evaporation. The vacuum evaporation for formation of the anode (hole injection/transport layer), the organic luminescence layer and the cathode (electron injection/transport layer) is performed at a temperature less than 200° C., for example, at room temperature. The resultant organic EL display device 300, which has the fiber-filled transparent plastic substrate excellent in surface smoothness, can suppress variations in display quality due to unevenness of the substrate surface, and thus can provide high display quality.

The display device of the present invention, provided with the plastic substrate, is suitably used for applications that must be light in weight, thin and good in shock resistance, and can provide higher-quality display than conventionally attained. The present invention is also applicable to display devices other than the liquid crystal display devices and the organic EL display devices, such as electrophoresis display devices.

While the present invention has been described in preferred embodiments, it will be apparent to those skilled in the art that the disclosed invention may be modified in numerous ways and may assume many embodiments other than that specifically set out and described above. Accordingly, it is intended by the appended claims to cover all modifications of the invention that fall within the true spirit and scope of the invention.

This non-provisional application claims priority under 35 USC §119(a) on Patent Application No. 2003-377069 filed in Japan on Nov. 6, 2003, the entire contents of which are hereby incorporated by reference.

What is claimed is:

1. A display device comprising:
   a first plastic substrate including a composite layer having a resin-impregnated glass fiber fabric, an inorganic barrier layer formed directly on the resin-impregnated glass fiber fabric, and a planarizing resin layer formed on the inorganic barrier layer; and
   a display medium layer formed on the planarizing resin layer-side of the first plastic substrate; wherein
   the planarizing resin layer has a surface having an unevenness of about 100 nm or less; and
   the display device is a transmissive display device or a transflective display device.

2. The display device of claim 1, further comprising a second plastic substrate placed to face the first plastic substrate via the display medium layer, wherein the second plastic substrate is the same in construction as the first plastic substrate.

3. The display device of claim 1, wherein the display medium layer includes an organic luminescence layer.

4. The display device of claim 1, wherein the display medium layer is a liquid crystal layer.

5. The display device of claim 4, wherein the inorganic barrier layer covers the entire area of the composite layer facing the display medium layer.

6. The display device of claim 1, wherein the resin-impregnated glass fiber fabric has an unevenness of about 500 nm to about 600 nm.

7. The display device of claim 1, wherein the inorganic barrier layer includes $SiO_2$ or $SiN_x$.

8. A display device comprising:
   a first plastic substrate including a composite layer having a resin-impregnated glass fiber fabric, a first planarizing resin layer formed directly on the resin-impregnated glass fiber fabric, an inorganic barrier layer formed directly on the first planarizing resin layer, and a second planarizing resin layer formed directly on the inorganic barrier layer; and
   a display medium layer formed on the planarizing resin layer-side of the first plastic substrate; wherein
   each of the first and the second planarizing resin layers has a surface having an unevenness of about 100 nm or less; and
   the display device is a transmissive display device or a transflective display device.

9. The display device of claim 8, wherein the inorganic barrier layer includes $SiO_2$ or $SiN_x$.

* * * * *